United States Patent
Frolov et al.

(10) Patent No.: US 8,012,788 B1
(45) Date of Patent: Sep. 6, 2011

(54) MULTI-STAGE FORMATION OF THIN-FILMS FOR PHOTOVOLTAIC DEVICES

(75) Inventors: Sergey Frolov, Murray Hill, NJ (US); Allan James Bruce, Scotch Plains, NJ (US); Michael Cyrus, Summit, NJ (US)

(73) Assignee: Sunlight Photonics Inc., South Plainfield, NJ (US)

(*) Notice: Subject to any disclaimer, the term of this patent is extended or adjusted under 35 U.S.C. 154(b) by 0 days.

(21) Appl. No.: 13/052,618

(22) Filed: Mar. 21, 2011

Related U.S. Application Data

(63) Continuation-in-part of application No. 12/603,285, filed on Oct. 21, 2009, now Pat. No. 7,910,396.

(51) Int. Cl.
*H01L 31/04* (2006.01)
*H01L 31/06* (2006.01)

(52) U.S. Cl. .......... 438/94; 438/22; 438/48; 438/93

(58) Field of Classification Search .......... 438/46–47, 438/77, 93–95, 285, 483, 572, 590, 602–604, 438/718, 767, 779, 796
See application file for complete search history.

(56) References Cited

U.S. PATENT DOCUMENTS

| | | | |
|---|---|---|---|
| 3,978,510 A | 8/1976 | Kasper et al. | |
| 4,181,256 A | 1/1980 | Kasagi | |
| 4,335,266 A | 6/1982 | Mickelsen et al. | |
| 4,652,332 A | 3/1987 | Ciszek | |
| 4,740,386 A | 4/1988 | Cheung | |
| 4,798,660 A | 1/1989 | Ermer et al. | |
| 5,441,897 A | 8/1995 | Noufi et al. | |
| 5,445,847 A | 8/1995 | Wada et al. | |
| 5,567,469 A | 10/1996 | Wada et al. | |
| 5,626,688 A | 5/1997 | Probst et al. | |
| 5,985,691 A | 11/1999 | Basol | |
| 6,107,562 A | 8/2000 | Hashimoto et al. | |
| 6,258,620 B1 * | 7/2001 | Morel et al. | 438/57 |

(Continued)

FOREIGN PATENT DOCUMENTS
JP 9326499 12/1997

(Continued)

OTHER PUBLICATIONS

Eberspacher, C. et al. "Thin-Film CIS alloy PV materials fabricated using non-vacuum, particles-based techniques", Thin Solid Films 387 (2001), pp. 18-22.

(Continued)

*Primary Examiner* — David Vu
*Assistant Examiner* — Jonathan Han
(74) *Attorney, Agent, or Firm* — Mayer & Williams PC; Stuart H. Mayer

(57) ABSTRACT

A method is provided for producing a film of compound material. The method includes providing a substrate and depositing a film on the substrate. The deposited film has a first chemical composition that includes at least one first chemical element and at least one second chemical element. At least one residual chemical reaction is induced in the deposited film using a source containing at least one second chemical element to thereby increase the content of at least one second chemical element in the deposited film so that the deposited film has a second chemical composition. The content of at least one second element in the second chemical composition is larger than the content of at least one second element in the first chemical composition.

18 Claims, 4 Drawing Sheets

U.S. PATENT DOCUMENTS

| | | | |
|---|---|---|---|
| 6,559,372 | B2 | 5/2003 | Stanbery |
| 6,974,976 | B2 * | 12/2005 | Hollars ................... 257/184 |
| 7,026,258 | B2 | 4/2006 | Taunier et al. |
| 7,537,955 | B2 | 5/2009 | Basol |
| 2002/0043279 | A1 | 4/2002 | Karg |
| 2005/0056312 | A1 * | 3/2005 | Young et al. ................ 136/258 |
| 2005/0183768 | A1 | 8/2005 | Roscheisen et al. |
| 2005/0236032 | A1 | 10/2005 | Aoki |
| 2006/0210640 | A1 | 9/2006 | Kerkhof |
| 2008/0041532 | A1 | 2/2008 | Chou et al. |
| 2008/0057203 | A1 | 3/2008 | Robinson et al. |
| 2008/0057616 | A1 | 3/2008 | Robinson et al. |
| 2008/0121277 | A1 | 5/2008 | Robinson et al. |
| 2008/0124831 | A1 | 5/2008 | Robinson et al. |
| 2008/0175982 | A1 | 7/2008 | Robinson et al. |
| 2008/0226270 | A1 | 9/2008 | Wendt et al. |
| 2009/0107550 | A1 | 4/2009 | Van Durgen et al. |
| 2009/0162969 | A1 | 6/2009 | Basol |
| 2009/0229666 | A1 | 9/2009 | Corneille et al. |
| 2010/0029036 | A1 | 2/2010 | Robinson et al. |

FOREIGN PATENT DOCUMENTS

| | | |
|---|---|---|
| JP | 2007096031 | 4/2007 |
| KR | 100246712 | 3/2000 |

OTHER PUBLICATIONS

P.K. Johnson et al. "A Comparative Study of Defect States in Evaporated and Selenized CIGS(S) Solar Cells", Publication date unknown, but prior to the filing date of the instant application, pp. 1-17.

Gregory M. Hanket et al., "Growth of Cu(inGA)(SeS)2 by the Reaction of Cu-GA-In Precursors in H2Se and H2S", University of Delaware, Institute of Energy Conservation, Publication date unknown, but prior to the filing date of the instant application, 2 pgs.

T. Pisaarkiewicz et al., "Fabrication of thin film polycrystaline CIS photovoltaic hetrostructure", Opto-Electron. Rev., vol. 11, No. 4, (2003), pp. 297-304.

Rommel Noufi and Ken Zweibel, "High-Efficiency CDTE and CIGS Thin-Film Solar Cells: Highlights and Challenges", National Renewable Engergy Laboratory, Golden, CO, Publication date unknown, but prior to the filing date of corresponding U.S. Appl. No. 12/185,369 (Aug. 4, 2008).

B. von Roedem et al., "Polycrystalline Thin-Film Photovoltaics: From the Laboratory to Solar Fields", May 2008, National Renewable Energy Laboratory, Golden, CO, pp. 1-4.

M. Raja Reddy, "Thin-Film solar cells for low cost space applications", European Space Agency, Dec. 1998, pp. 2-41.

Peter T. Erslev et al. "Study of the Electronic Properties of Matched Na-containing and Na-free CIGS Samples Using Junction Capacitance Methods", Publication date unknown, but prior to the filing date of the instant application, 6 pgs.

D. Bremaud et al., "Towards the Development of Flexible CIGS Solar Cells on Polymer Films with Efficiency Exceeding 15%", Publication date unknown, but prior to the filing date of the instant application, 4 pgs.

* cited by examiner

MULTI-STAGE FORMATION OF THIN-FILMS FOR PHOTOVOLTAIC DEVICES

FIELD

The present invention relates to a method for forming a compound material thin film, such as a semiconductor thin-film suitable for use in photovoltaic solar cells and other devices.

RELATED ART

One of the major contributors to current worldwide generation of renewable energy is the solar energy produced via a photovoltaic (PV) effect. PV-based renewable-energy sources generate energy, in the form of electricity, by harnessing electromagnetic radiation, such as sunlight. PV applications are not limited to any particular area of the world and/or any given sector of the economy. In remote regions of the world, for example, an off-grid installation of the PV source provides the only available source of electricity. In highly populated and/or economically developed regions, the PV source may, for example, source electricity to an electrical grid to supplement and/or reduce the amount of conventional energy distributed from the electrical grid. A PV source is in general any electric system containing a PV device, such as a PV cell or a PV module.

PV devices are frequently used to convert optical energy into electrical energy. Typically, a photovoltaic device is made of one or two semiconductors with p-doped and n-doped regions. The commercialization of PV devices depends on technological advances that lead to higher efficiencies and lower cost of such devices. The cost of electricity can be significantly reduced by using PV devices constructed from compound thin film semiconductors, such as copper indium gallium selenide (CIGS).

Several techniques have been developed for producing thin-film PV materials. Thin films of alloys based on amorphous silicon can be produced using chemical vapor deposition (CVD). CdTe films may be manufactured in a number of different ways, which include electro-deposition and vapor transport deposition. The CVD process is relatively expensive and not suitable for compound semiconductors, such as CIGS. Less expensive techniques developed for CdTe are also not applicable for other thin-film PV materials. CIGS films are mainly made using either an elemental co-evaporation process or a two-stage process, in which sputtering of a precursor film is followed by its selenization. The two-stage process is relatively easier to scale up in volume in comparison with the co-evaporation process, but it has drawbacks, such as loss of adhesion between the absorber layer and the back contact layer during selenization.

SUMMARY

In accordance with one aspect of the invention, a method is provided for producing a film of compound material. The method includes providing a substrate and depositing a film on the substrate. The deposited film has a first chemical composition that includes at least one first chemical element and at least one second chemical element. At least one residual chemical reaction is induced in the deposited film using a source containing at least one second chemical element to thereby increase the content of at least one second chemical element in the deposited film so that the deposited film has a second chemical composition. The content of at least one second element in the second chemical composition is larger than the content of at least one second element in the first chemical composition.

In accordance with another aspect of the invention, a method is provided for producing a thin-film solar cell that includes depositing a first contact layer on a substrate and producing an absorber layer over the first contact layer. A window layer and a second contact layer are deposited over the absorber layer. The absorber layer is produced by a process that includes depositing a film over the first contact layer. The deposited film has a first chemical composition that includes at least one first chemical element and a second chemical element. A residual chemical reaction is induced in the deposited film using a source containing the second chemical element to thereby increase the content of the second chemical element in the deposited film so that the deposited film has a second chemical composition.

DETAILED DESCRIPTION

In the following detailed description, numerous specific details are set forth in order to provide a thorough understanding of exemplary embodiments or other examples described herein. However, it will be understood that these embodiments and examples may be practiced without the specific details. In other instances, well-known methods, procedures, components and circuits have not been described in detail, so as not to obscure the following description. Further, the embodiments disclosed are for exemplary purposes only and other embodiments may be employed in lieu of, or in combination with, the embodiments disclosed.

Figure 1:
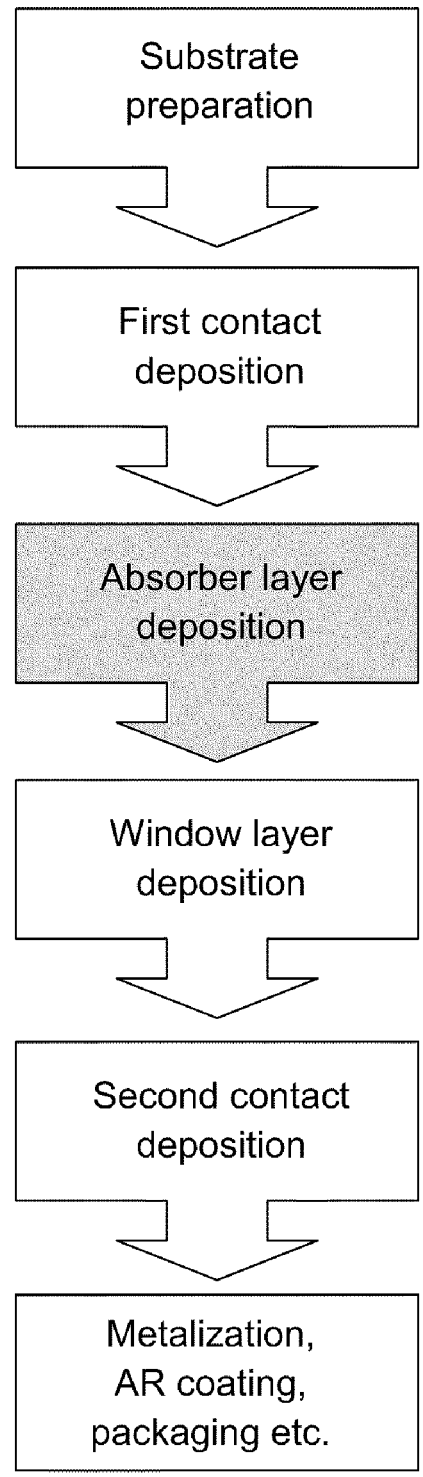
FIG. 1 shows a process for producing a thin-film solar cell.
Figure 2:
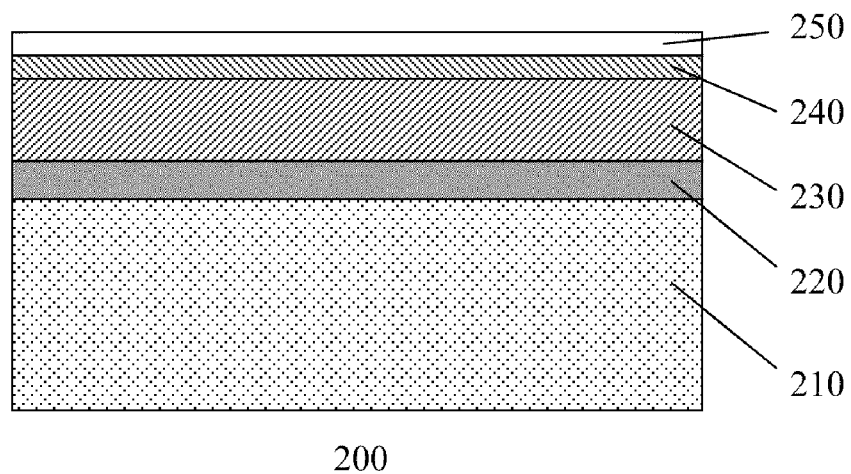
FIG. 2 shows a substrate configuration of a thin-film solar cell

In accordance with the present invention, FIG. 1 illustrates an example of a process for manufacturing the thin-film photovoltaic (PV) device 200 shown in FIG. 2. This process includes several steps starting with the substrate preparation. Substrate 210 may be a glass sheet, a metal foil or a plastic film. First contact layer 220 may be deposited onto substrate 210 using a sputtering process. The first contact may serve as the back contact and contain metals, such as molybdenum (Mo), or transparent conducting oxides (TCO), such as tin oxide ($SnO_2$). The next optional processing step may include a laser scribing process, in which the first contact layer is divided into several electrically disconnected regions that in turn define individual PV cells. Subsequently, a thin absorber layer 230 is deposited on top of the first contact layer 220 using a multi-stage deposition process, which will be described in detail below. The absorber material may be based on CIGS, CdTe, a-Si, organic semiconductors and other thin-film semiconductors. A thin layer of another semiconductor material may be then deposited by a sputtering process, for instance, to produce a window layer 240, thus forming a pn junction with the absorber layer 230 underneath. Additional optional processing may include a mechanical scribing process, in which the absorber and window layers are divided into several electrically disconnected regions that in turn define individual PV cells. Subsequent to these steps, a second contact layer 250 is produced to create a functioning PV device 200. The second contact may serve as the front contact and contain TCO, such as indium tin oxide (ITO) or Al-doped zinc oxide (AZO). In addition, this manufacturing process may include various subsequent steps such as additional mechanical scribing, deposition of metal grid contacts, anti-reflection coating, lamination, packaging, etc.

Figure 3:
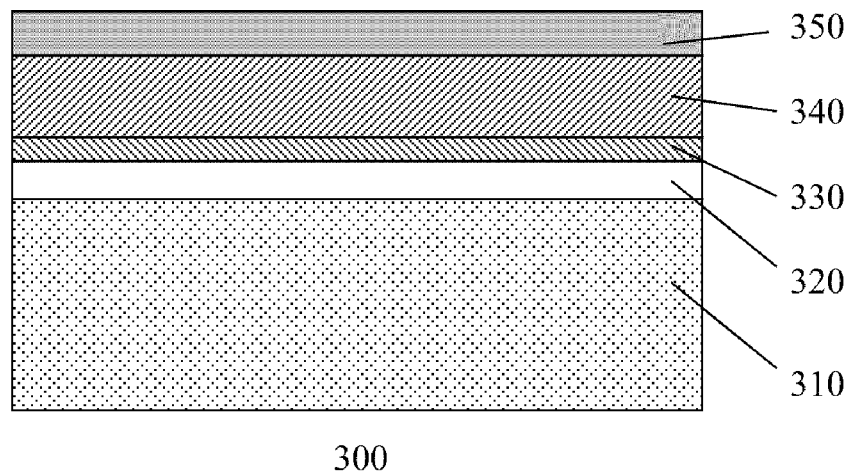
FIG. 3 shows a superstrate configuration of a thin-film solar cell

In one alternative implementation, the manufacturing process of FIG. 1 may be modified to produce the thin-film PV device 300 illustrated in FIG. 3. In the modified process the window layer deposition precedes the absorber layer deposition. In this case, PV device 300 includes substrate 310, first contact layer 320, window layer 330, absorber layer 340, and second contact 350. The first contact may serve as the front contact and the second contact may serve as the back contact.

Figure 4:
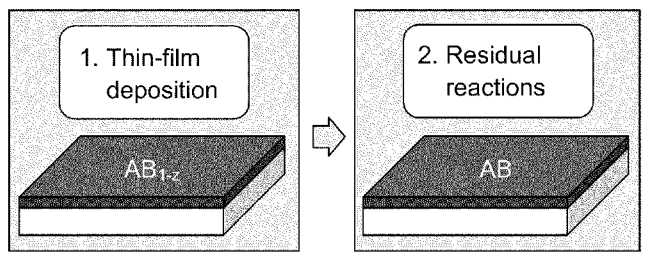
FIG. 4 shows a multi-stage formation of a binary compound thin-film.

As previously mentioned, absorber layers 230 and 340 may be formed using a multi-stage process, an example of which is shown in FIG. 4. First, a film is produced with a chemical composition $AB_{1-z}$, which may be similar or close to the chemical composition of a compound PV semiconductor AB, where A and B are different chemical elements and A may also be an alloy of different chemical elements. The value of (1−z), where z is the chemical deficiency of element B, can be defined as the ratio between the initial element B content to the final element B content; z may be in the range of 0.05 to 0.95, preferably in the range of 0.15-0.4.

It is generally preferable for the compound semiconductor AB to be sufficiently stoichiometric and thus have a single phase crystalline structure at room temperature. On the other hand, the compound material $AB_{1-z}$ may be non-stoichiometric and thus contain different crystalline phases. In the latter case the composition $AB_{1-z}$ refers to the composition averaged across the volume of the deposited thin film. Compound material $AB_{1-z}$ may also differ from the compound semiconductor AB in its physical properties, e.g. it may be an electrical conductor rather than a semiconductor.

Compound material $AB_{1-z}$ in the film may be a mixture of its constituent elements, e.g. a mixture of fine powders of elements A and B, respectively, wherein the characteristic particle size may be less than one micron, preferably in the range of 5-50 nm. It is preferable however that the compound material $AB_{1-z}$ is a fully reacted, chemically stable material that is not just a mixture of its constituent elements. In this material chemical bonds are formed between its different elements and its chemical composition and crystalline structure may be substantially homogeneous from large to very small scales (~few nm).

In the first step shown in FIG. 4 a thin film comprising semiconductor $AB_{1-z}$ may be deposited using a variety of approaches, including a physical vapor deposition (PVD) process, a magnetron sputtering process, an elemental co-evaporation, a non-vacuum nanoparticle deposition and others. For example, a pre-reacted bulk material having chemical composition $AB_{1-z}$ may be dispersed and deposited onto a substrate in the form of a thin film with substantially the same chemical composition $AB_{1-z}$. In the second step, a residual chemical reaction process is induced in the film when it is placed in an atmosphere of vapor containing element B. As result of the chemical reaction, a PV absorber film is produced with the chemical composition AB. Chemical elements A and B may be, for example, chemical elements selected from groups II and VI, respectively. Group II elements include such elements as Mg, Zn, Cd, and Hg, whereas group VI elements include S, Se and Te. The latter group of elements is commonly known as chalcogens and the compound materials based on these elements are called chalcogenides. In one example the compound chalcogen semiconductor AB may be CdTe.

This aforementioned process is also applicable to compound semiconductor materials comprising more than two constituent chemical elements. For example, in the case of a ternary semiconductor film a film having chemical composition $ABC_1$—, is first deposited onto a substrate. Afterwards, a residual chemical reaction is used to change the chemical composition of the film to ABC. Chemical elements A, B and C may be, for example, chemical elements from groups I, III and VI, respectively. Group I elements include such elements as Cu, Ag and Au, group III elements include Al, In, Ga and Tl, whereas group VI elements include S, Se and Te. In this case the compound semiconductor ABC may be, for example, $CuInSe_2$. In addition, chemical elements from other groups may be used, e.g. Sn from group IV.

Similarly, the multi-stage process described above may be used with quaternary semiconductors and other materials comprising more than four elements. For instance, in the above example of the ternary compound semiconductor $CuInSe_2$, chemical elements from either group I, group III or group VI may be partially substituted with different elements from the same group. For example, Cu may be partially substituted with Ag, In may be partially substituted with Ga, and Se may be partially substituted with S. Such substitution does not alter the basic crystalline structure of the material and therefore does not produce any associated crystalline defects. It is frequently used to change electronic and optical properties of the material, e.g. to increase the optical bandgap in $CuInSe_2$ one may substitute In fully or partially with Ga.

Figure 5:
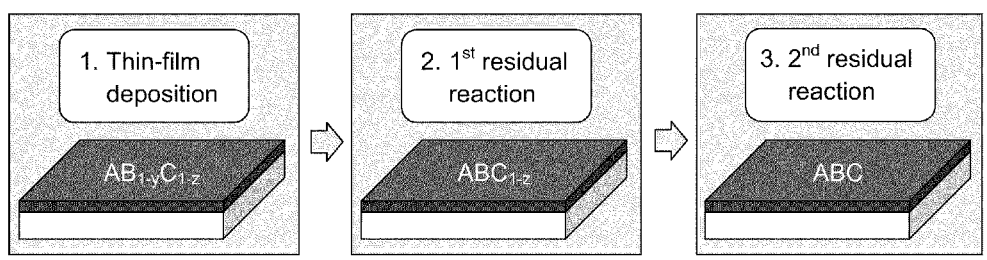
FIG. 5 shows a multi-stage formation of a ternary compound thin-film.

The multi-stage formation process is particularly applicable to compound semiconductor materials comprising more than two constituent chemical elements. For the formation of compound materials having multiple constituent elements with compositional deficiencies, the multi-stage process may include multiple residual reaction steps each corresponding to a specific deficient element. For example, in the case of a ternary compound material film a film having an initial chemical composition $AB_{1-y}C_{1-z}$ is first deposited onto a substrate, where elements B and C are deficient. Subsequently, several residual chemical reaction steps are used to change the chemical composition of the deposited film to ABC as shown in FIG. 5. In the first residual reaction step, an additional quantity y of element B is provided to produce a film with an intermediate composition $ABC_{1-z}$. In the second residual reaction step, an additional quantity z of element C is provided to produce a film with the final composition ABC. It also may be possible to combine multiple residual reactions in a single processing step, where more than a single element is added to the chemical composition (e.g. B and C in the above example).

Figure 6:
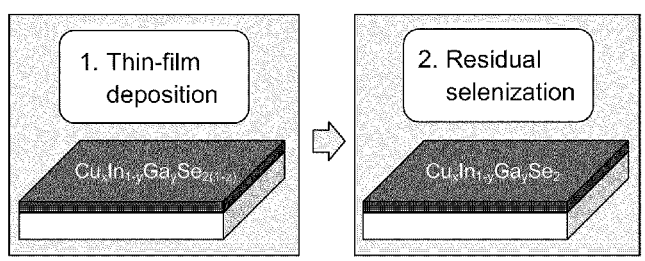
FIG. 6 shows a multi-stage formation of a CIGS compound thin-film.

FIG. 6 shows an example of a multi-stage formation process that employs a CIGS film. In the first step, a thin CIGS* film is produced with a chemical composition $Cu_xIn_{1-y}Ga_ySe_{2(1-z)}$, which is close to the chemical composition of a compound PV semiconductor $Cu_xIn_{1-y}Ga_ySe_2$. The Cu content x may be in the range of 0.6 to 1.0, and preferably in the range of 0.8-0.95. The Ga content y, which determines the CIGS optical bandgap, may be in the range of 0.1-1.0, and preferably in the range of 0.2-0.35. The Se deficiency z may be in the range of 0.1-0.9, and preferably in the range of 0.5-0.85. In the second step. A residual selenization process is used to induce additional chemical reactions in the deposited film to thereby adjust the chemical composition of the film so that it has the composition $Cu_xIn_{1-y}Ga_ySe_2$.

Figure 7:
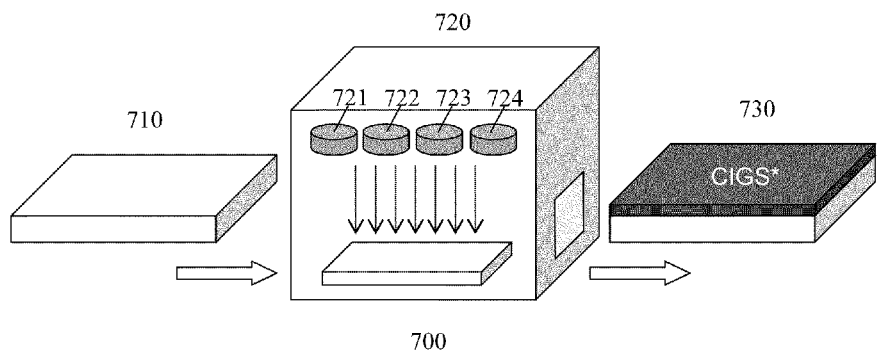
FIG. 7 shows a process for depositing a CIGS* film.

FIG. 7 shows schematically a method for the deposition of CIGS* thin films. The CIGS* film may be deposited by evaporation and/or sputtering from one or more targets (721, 722, 723 and 724). Target materials may include high purity single elements, such as Cu, In, Ga, Se and S, partially reacted compounds and allows, such as $Cu_2Se$, InGa, $In_xSe$, $Ga_ySe$, CuInGa and others, and fully reacted compounds, such as $Cu_xIn_{1-y}Ga_ySe_{2(1-z)}$. In this deposition process a flat rigid substrate 710 may be used that has been prepared and processed prior to the deposition as described above. Alternatively, in a roll-to-roll deposition system a flexible substrate may be used. A vacuum deposition system 720 may employ, for example, a magnetron sputtering tool to deposit a thin CIGS* film 730 on the substrate. DC magnetron sputtering may be used for electrically conductive targets such as metallic alloys, which is a faster process compared to the RF sputtering that is normally used with dielectrics. Alternatively, non-vacuum deposition methods such as ink jet printing may be used. For example, the CIGS* bulk material may be pulverized into small particles, dispersed, coated on the substrate and then annealed to form a thin CIGS* film. These approaches of course may be utilized with other compound materials.

Figure 8:
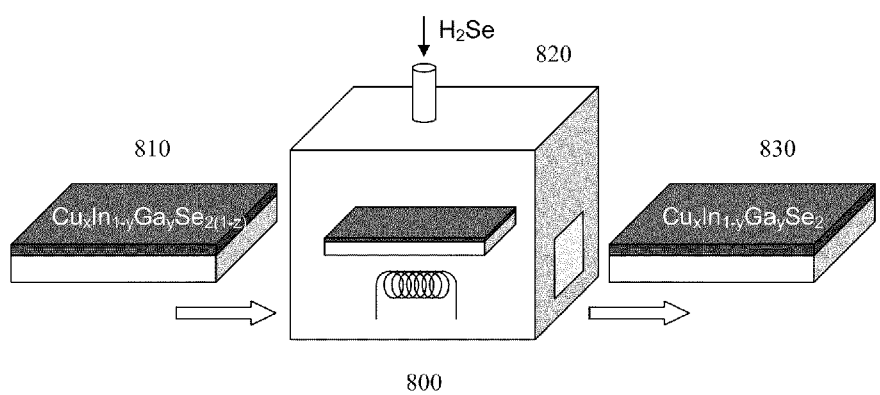
FIG. 8. shows a selenization process of a CIGS* film.

FIG. 8 shows schematically a method for the residual selenization step, in which a thin CIGS* film on a substrate 810 having the initial composition $Cu_xIn_{1-y}Ga_ySe_{2(1-z)}$ is first transported into a chamber 820. Se-containing gas, such as $H_2Se$ or $Se_2$, is delivered to chamber 820 and the film on the substrate 810 is heated. Under these conditions, Se atoms diffuse into the film to complete the formation of the CIGS film 830, which has the final composition $Cu_xIn_{1-y}Ga_ySe_2$. The chemical reaction may be controlled by temperature and time. For example, residual selenization may be accomplished using temperatures in the range from 400° C. to 550° C. and a reaction time in a range of 5 to 30 minutes. The reaction time may be chosen to allow a sufficient amount of Se (in proportion to Se deficiency) to diffuse and react with the rest of the elements in the film. Selenization and other similar reactions, such as for example sulfurization, under appropriate conditions of temperature and pressure may be self-limiting. This implies that upon the formation of a stoichiometric compound of $Cu_xIn_{1-y}Ga_ySe_2$, further incorporation of Se into the film stops and the selenization reaction terminates. An example of appropriate conditions for such a self-limiting reaction may be a sufficiently high processing temperature, at which chalcogens, which are in excess to the stoichiometry and not chemically bound with other film constituents, can exhibit a significant partial vapor pressure and may preferentially be lost from the film through vaporization. This is particularly convenient in large scale manufacturing, where processes requiring less control are less expensive, more reliable and thus more attractive. After residual selenization, the CIGS film is fully reacted, forming a chalcopyrite polycrystalline structure with a minimal amount of crystalline defects associated with deficiencies of its constituent elements (Se in particular).

In accordance with the present invention, the multi-stage thin film deposition process may be applied to a variety of other compound materials. Examples include:

1. $Cu_xIn_{1-y}Ga_yS_2$. First, a thin film is produced in a PVD process with a chemical composition $Cu_xIn_{1-y}Ga_yS_{2(1-z)}$. Cu content x may be in the range of 0.6 to 1.0, preferably in the range of 0.8-0.95. Ga content y may be in the range of 0.05-1.0, preferably in the range of 0.1-0.35. S deficiency z may be in the range of 0.1-0.9, preferably in the range of 0.5-0.85. Second, a residual sulferization process is used to adjust the chemical composition of the film to $Cu_xIn_{1-y}Ga_yS_2$.

2. $Cu_xIn_{1-y}Ga_yS_{2z}Se_{2(1-z1)}$. First, a thin film is produced in a PVD process with a chemical composition $Cu_xIn_{1-y}Ga_yS_{2z}Se_{2(1-z1)}$. Cu content x may be in the range of 0.6 to 1.0, preferably in the range of 0.8-0.95. Ga content y may be in the range of 0.05-1.0, preferably in the range of 0.1-0.3. S content z may be in the range of 0.0-1.0, whereas Se deficiency z1 may be in the range of 0.1-1.0 so that z1>z. Second, a residual selenization process is used to adjust the chemical composition of the film to $Cu_xIn_{1-y}Ga_yS_{2z}Se_{2(1-z)}$. For this compound either residual selenization, sulfurization or a combination of the two processes (e.g. employing vapors of both $S_2$ and $Se_2$) may be used in the last stages of the deposition process.

3. $Cu_xIn_{1-y}Al_ySe_{2(1-z)}$. First, a thin film is produced in a PVD process with a chemical composition $Cu_xIn_{1-y}Al_ySe_{2(1-z)}$. Cu content x may be in the range of 0.6 to 1.0, preferably in the range of 0.8-0.95. Al content y may be in the range of 0.05-1.0, preferably in the range of 0.4-0.6. Se deficiency z may be in the range of 0.1-0.9, preferably in the range of 0.5-0.85. Second, a residual selenization process is used to adjust the chemical composition of the film to $Cu_xIn_{1-y}Al_ySe_2$.

4. $Cu_{x1}Ag_{x2}In_{1-y}Ga_ySe_2$. First, a thin film is produced in a PVD process with a chemical composition $Cu_{x1}Ag_{x2}In_{1-y}Ga_ySe_{2(1-z)}$. Cu content x1 and Ag content x2 may be in the range of 0.1 to 1.0, so that x1+x2<1. Ga content y may be in the range of 0.05-1.0, preferably in the range of 0.1-0.35. Se deficiency z may be in the range of 0.1-0.9, preferably in the range of 0.5-0.85. Second, a residual selenization process is used to adjust the chemical composition of the film to $Cu_{x1}Ag_{x2}In_{1-y}Ga_ySe_2$.

5. $Cu_xZn_{1-y}Sn_yS_2$. First, a thin film is produced in a PVD process with a chemical composition $Cu_xZn_{1-y}Sn_yS_{2(1-z)}$. Cu content x may be in the range of 0.6 to 1.0, preferably in the range of 0.8-0.9. Sn content y may be in the range of 0.05-1.0, preferably in the range of 0.3-0.45. S deficiency z may be in the range of 0.1-0.9, preferably in the range of 0.5-0.85. Second, a residual sulferization process is used to adjust the chemical composition of the film to $Cu_xZn_{1-y}Sn_yS_2$.

6. $Cu_xInS_2$. First, a thin film is produced in a PVD process with a chemical composition $Cu_xInS_{2(1-z)}$. Cu content x may be in the range of 0.6 to 1.0, preferably in the range of 0.8-0.9. S deficiency z may be in the range of 0.1-0.9, preferably in the range of 0.5-0.85. Second, a residual sulferization process is used to adjust the chemical composition of the film to $Cu_xInS_2$.

7. CdTe. First, a thin film is produced in a PVD process with a chemical composition $CdTe_{1-z}$. Te deficiency z may be in the range of 0.1-0.9, preferably in the range of 0.5-0.85. Second, a residual chemical process with Te vapor is used to adjust the chemical composition of the film to CdTe.

8. $Cd_{1-x}Mg_xTe$. First, a thin film is produced in a PVD process with a chemical composition $Cd_{1-x}Mg_xTe_{1-z}$. Mg content x may be in the range of 0.0-1.0, preferably in the range of 0.1-0.6. Te deficiency z may be in the range of 0.1-0.9, preferably in the range of 0.5-0.85. Second, a residual chemical process with Te vapor is used to adjust the chemical composition of the film to $Cd_{1-x}Mg_xTe$.

9. $Cd_{1-x}Zn_xTe$. First, a thin film is produced in a PVD process with a chemical composition $Cd_{1-x}Zn_xTe_{1-z}$. Zn content x may be in the range of 0.0-1.0, preferably in the range of 0.1-0.6. Te deficiency z may be in the range of 0.1-0.9, preferably in the range of 0.5-0.85. Second, a residual chemical process with Te vapor is used to adjust the chemical composition of the film to $Cd_{1-x}Zn_xTe$.

These and other suitable compound materials may also include minor dopants that have relatively small concentrations and thus do not significantly alter the overall chemical composition and the associated crystalline structure. For example, CIGS compounds may include 0.01-0.3 at. % of sodium (Na), which facilitates grain growth in CIGS films and also improves their electrical properties. In this case Na may be added to the bulk material and then transferred to the film with other CIGS elements during deposition. Also, in the initial deposition of a thin-film its constituents may include temporary chemical elements that may be removed from the film during subsequent processing steps. For example, such a deposition process may involve one of the oxide compounds, i.e. CuO, $In_2O_3$ and $Ga_2O_3$, where oxygen may be later removed by chemical reduction using hydrogen gas.

The multi-stage thin film formation process provides several advantages over the existing film forming processes. Residual chemical reactions in the deposited film enable more flexible control of the film's morphology. Specifically, they promote polycrystalline grain growth and grain fusing. The volumetric expansion of the film associated with these chemical reactions removes pinholes and improves intergrain electrical transport. It is also known that the interlayer adhesion may be compromised by the film's exposure to the high temperatures typically required by chemical reactions in the existing deposition processes. The multi-stage process can improve the adhesion between the absorber layer and the first contact layer by substantially reducing the amount of chemical reactions required in the film after deposition.

Example 1

In this example the multi-stage process is used to deposit a CIGS film with the approximate chemical composition of $CuIn_{0.7}Ga_{0.3}Se_2$ so that it may be used in a CIGS solar cell. As a first step, powders of Cu, In, and Ga Se are mixed in the proportions corresponding to $Cu_{0.9}In_{0.7}Ga_{0.3}$. The mixture is melted and fully alloyed in a pressurized enclosed vessel at a temperature of about 1000° C. In this case Cu deficiency is a desired characteristic feature of the CIGS film which is known to improve electrical properties of CIGS films. The resulting bulk material is then used to produce a target suitable for use in a DC sputtering system. This target and a pure Se target is then used in a magnetron co-sputtering system to deposit a thin CIGS* film with a chemical composition of $Cu_{0.9}In_{0.7}Ga_{0.3}Se_{1.6}$. A soda lime glass coated with a 0.7 □m thick Mo layer is used as a substrate. The substrate temperature during the deposition may be in the range of 100° C. to 550° C. Lower substrate temperature may reduce Se mobility and enable better compositional control of the film. The deposited CIGS* film thickness may be in the range of 1 to 3 □m. In the last step, this film is heated in the presence of $H_2Se$ for 10-30 min at a temperature of about 400-500° C. During this process additional Se is incorporated into the film so that at the end of the process the film composition is about $Cu_{0.9}In_{0.7}Ga_{0.3}Se_2$.

Example 2

In this example the multi-stage process is used to deposit a CIGS film with the approximate chemical composition of $CuGaSe_2$ so that it may be used in a CIGS solar cell. As a first step, Cu, Ga and Se are co-evaporated to produce a film with an average composition corresponding to $Cu_{0.9}GaSe_{1.7}$. A polyimide film coated with a ~0.5-1 □m thick Mo layer is used as a substrate. The deposited CIGS* film thickness is in the range of 0.5 to 2 □m. In a third step, this film is heated in the presence of $H_2Se$ for 10-30 min at a temperature of about 400-500° C. During this process additional Se is incorporated into the film so that at the end of the process the film composition is about $Cu_{0.9}GaSe_2$.

What is claimed is:

1. A method for producing a film of compound material comprising the steps of providing a substrate;
   depositing a film on the substrate, wherein the deposited film has a first chemical composition that includes at least one first chemical element and at least one second chemical element;
   inducing at least one residual chemical reaction in the deposited film using a source containing at least one second chemical element to thereby increase the content of at least one second chemical element in the deposited film so that the deposited film has a second chemical composition; wherein the content of at least one second element in the second chemical composition is larger than the content of at least one second element in the first chemical composition.

2. A method of claim 1 wherein said at least one first chemical element comprises a plurality of chemical elements.

3. A method of claim 1 wherein said at least one second chemical element comprises a plurality of chemical elements.

4. A method of claim 1 wherein said at least one first chemical element comprises at least one element from group I and group III chemical elements.

5. A method of claim 1 wherein said at least one second chemical element comprises an element from group VI.

6. A method of claim 1 wherein said substrate comprises a first contact layer.

7. A method of claim 1 wherein at least one second element content in the deposited film is increased by at least 10%.

8. A method of claim 1 wherein said step of depositing the film comprises the steps of preparing the compound bulk materials from said at least one first chemical element and at least one second chemical element, forming at least one sputtering target from the compound bulk materials and sputtering the compound bulk materials onto the substrate.

9. A method of claim 1 wherein said step of depositing the film comprises the step of evaporating from bulk materials comprising at least one first and at least one second chemical element onto the substrate.

10. A method of claim 1 wherein said at least one residual chemical reaction is produced at a temperature of at least 400° C.

11. A method of claim 1 wherein said the step of inducing at least one residual chemical reaction includes exposing the film to a vapor that includes at least one second chemical element.

12. A method of claim 1 wherein said second chemical composition is stoichiometric.

13. A method of claim 1 wherein said at least one residual chemical reactions produce a film having a single crystalline phase.

14. A method of claim 1 wherein said first chemical composition comprises Cu, In, Ga and Se.

15. A method of claim 1 wherein said first chemical composition comprises Cd and Te.

16. A thin-film formed in accordance with the method of claim 1.

17. A method for producing a thin-film solar cell comprising the steps of
    depositing a first contact layer on a substrate;
    producing an absorber layer over the first contact layer;
    depositing a window layer and a second contact layer over the absorber layer,
    wherein the absorber layer is produced by a process that includes:
        depositing a film over the first contact layer, wherein the deposited film has a first chemical composition that includes at least one first chemical element and a second chemical element;
        inducing a residual chemical reaction in the deposited film using a source containing the second chemical element to thereby increase the content of the second chemical element in the deposited film so that the deposited film has a second chemical composition.

18. A thin-film solar cell formed in accordance with the method of claim 17.

* * * * *